United States Patent [19]

Gerson et al.

[11] Patent Number: 5,548,230
[45] Date of Patent: Aug. 20, 1996

[54] HIGH-SPEED CMOS PSEUDO-ECL OUTPUT DRIVER

[75] Inventors: Brian D. Gerson; Kevin Huscroft, both of Coquitlam, Canada; Martin Mallinson, Billerica, Mass.

[73] Assignee: PMC-Sierra, Inc., Burnaby, Canada

[21] Appl. No.: 251,960

[22] Filed: Jun. 1, 1994

[30] Foreign Application Priority Data

May 31, 1994 [CA] Canada ................................. 2124745

[51] Int. Cl.⁶ .......................................... H03K 19/0175
[52] U.S. Cl. ............................... 326/73; 326/88; 341/136
[58] Field of Search ................................ 341/133, 136; 326/73, 88

[56] References Cited

U.S. PATENT DOCUMENTS

| | | | |
|---|---|---|---|
| 4,704,549 | 11/1987 | Sanwo et al. | 307/475 |
| 5,074,671 | 9/1991 | Suthar et al. | 307/451 |
| 5,105,102 | 2/1991 | Shioda | 307/443 |
| 5,216,297 | 6/1993 | Proebstring | 307/475 |

OTHER PUBLICATIONS

Steyart et al; "ECL–CMOS and CMOS–ECL Interface in 1.2 μm CMOS For 150–MHz Digital ECL Data Transmission Systems"; IEEE Journal of Solid–State Circuits; vol. 26, No. 1; Jan. 1991; pp. 18–24.

*Primary Examiner*—Edward P. Westin
*Assistant Examiner*—Stephen Calogero
*Attorney, Agent, or Firm*—Pascal & Associates

[57] ABSTRACT

A complementary metal oxide silicon (CMOS) data to emitter coupled logic (ECL) data translator system comprised of translator apparatus for receiving data signals from a CMOS circuit powered from a CMOS voltage power source, apparatus for powering an ECL circuit from the power source, a transmission line carrying output signals from the translator apparatus to the ECL circuit, having a predetermined characteristic, a load having the characteristic impedance connecting the transmission line to the power source, and the translator apparatus comprising apparatus for outputting a data signal on the transmission line which corresponds to the received data signals but having an amplitude compatible with the ECL circuit and referenced to a voltage of the power source.

6 Claims, 7 Drawing Sheets

HIGH-SPEED CMOS PSEUDO-ECL OUTPUT DRIVER

FIELD OF THE INVENTION

This invention relates to the field of logic circuits, and in particular to a CMOS to ECL logic converter.

BACKGROUND TO THE INVENTION

High speed electronic logic systems are often comprised of a mixture of silicon integrated circuit (IC) technologies. A system may be formed of complementary metal oxide silicon (CMOS) field effect transistors (FETs), transistor-transistor logic (TTL) transistors, or emitter coupled logic (ECL) devices. A system designer will choose the best silicon IC technologies, in terms of cost or performance, for each function of the system being designed. For example, medium to low-speed computational functions have been found to be better implemented in CMOS, high speed serial functions have been found to be better suited for ECL, and TTL is used where moderately high-speed is required but the extra complexity of ECL is not warranted.

Connecting sub-systems that use all of these silicon technologies is difficult. A CMOS to ECL interface poses a particular challenge, because of differences is logic voltage swings and power supplies. Typically, CMOS logic voltage swings between +5 volts for a logical "1" and 0 volts for a logical "0". On the other hand, ECL data signals swing between −0.8 volts for a logical "1" and −1.8 volts for a logical "0". CMOS devices are nominally powered with a 5 volt supply, and ECL devices are powered with a −4.8 to −5.2 volt supply. Therefore, the system designer has power supply, voltage swing, and logic level reference level problems when an attempt is made to create CMOS to ECL interfaces in a design. CMOS output signals must be translated to be suitable for use with standard ECL devices.

Part of these problems can be solved if the system designer chooses to power ECL devices with the same 5 volt power supply used for the CMOS and TTL devices. The VCC terminal of the ECL circuit is connected to 5 volts, and its VEE terminal is connected to the system ground. While ECL devices are very susceptible to noise on their VEE rail, if this rail is decoupled well and if differential devices are used, this powering scheme has been found to be tractable.

A remaining problem, however, is to create a CMOS output with logical swings that match that of an ECL device relative to the 5 volt, or VDD supply rail.

In the article "ECL-CMOS and CMOS-ECL Interface in 1.2μm CMOS for 150-MHz Digital ECL Data Transmission System", IEEE Journal of Solid-State Circuits, Vol 26, No. 1, January 1991, by Michael S. J. Steyaert, et al, a circuit is described in which high speed current switches are controlled by a replicated bias scheme. However this circuit requires an external termination voltage supply, and its output driver has been found to be unstable under some conditions.

SUMMARY OF THE INVENTION

The present invention is a system for converting CMOS logic signals to ECL logic signals, which, while using a replicated bias scheme similar to the one of Steyaert et al, requires no external termination voltage supply, and which has been found to be stable under all conditions. A single voltage supply, which can be the same one powering the CMOS circuits and the ECL circuits, can be used to power the circuits of the present invention. The present invention can be configured with two external resistors for each data channel for different termination values and logical swings, and is designed to track changes over process, supply rail and temperature.

A successful laboratory prototype contains a pseudo-ECL transmitter (PETX) which receives two single-ended input signals, a high speed digital clock stream (<=155 MHz) and a high speed data stream (<=77.5 MHz) and transmits two fully differential ECL voltage swing compatible output signals. These output signals can be DC coupled to board-level ECL devices when they are biased between 5 V and ground in a pseudo-ECL mode.

In accordance with an embodiment of the invention, a complementary metal oxide silicon (CMOS) data to emitter coupled logic (ECL) data translator system is comprised of a translator circuit for receiving data signals from a CMOS circuit powered from a CMOS voltage power source, a circuit for powering an ECL circuit from the power source, a transmission line carrying output signals from the translator circuit to the ECL circuit, having a predetermined characteristic, a load having the characteristic impedance connecting the transmission line to the power source, and the translator circuit comprising a circuit for outputting a data signal on the transmission line which corresponds to the received data signals but having an amplitude compatible with the ECL circuit and referenced to a voltage of the power source.

In accordance with another embodiment, the translator circuit is comprised of a one bit digital to analog converter (DAC) and is further comprised of a pair of programmable current steering switches connected to the DAC for establishing higher and lower output currents for opposite logic values of the output signals, a circuit for applying the data signals to the DAC and for receiving the output signals and applying them to the transmission line.

BRIEF INTRODUCTION TO THE DRAWINGS

A better understanding of the invention will be obtained by reading the description of the invention below, with reference to the following drawings, in which:

FIG. 1 is a general block diagram of an embodiment of the system invention,

FIG. 2 is a block diagram of a preferred embodiment of the translator (PETX) of the system, FIG. 3 is a block diagram of an ECL CORE circuit 16, used in the translator or FIG. 2, FIG. 4 illustrates a bootstrap circuit used in the ECL CORE circuit of FIG. 3, FIG. 5 is logic diagram of the phase splitter described with reference to FIG. 4, FIG. 6 is a block schematic of the ECL SUB3 circuit described with reference to FIG. 3, FIG. 7 is a schematic diagram of a programmable current steering switched in the ECL SUB3 circuit described with reference to FIG. 3, FIG. 8 is a block diagram illustrating a circuit for generating the control voltages VA and VB,

DETAILED DESCRIPTION OF THE INVENTION

Figure 1:
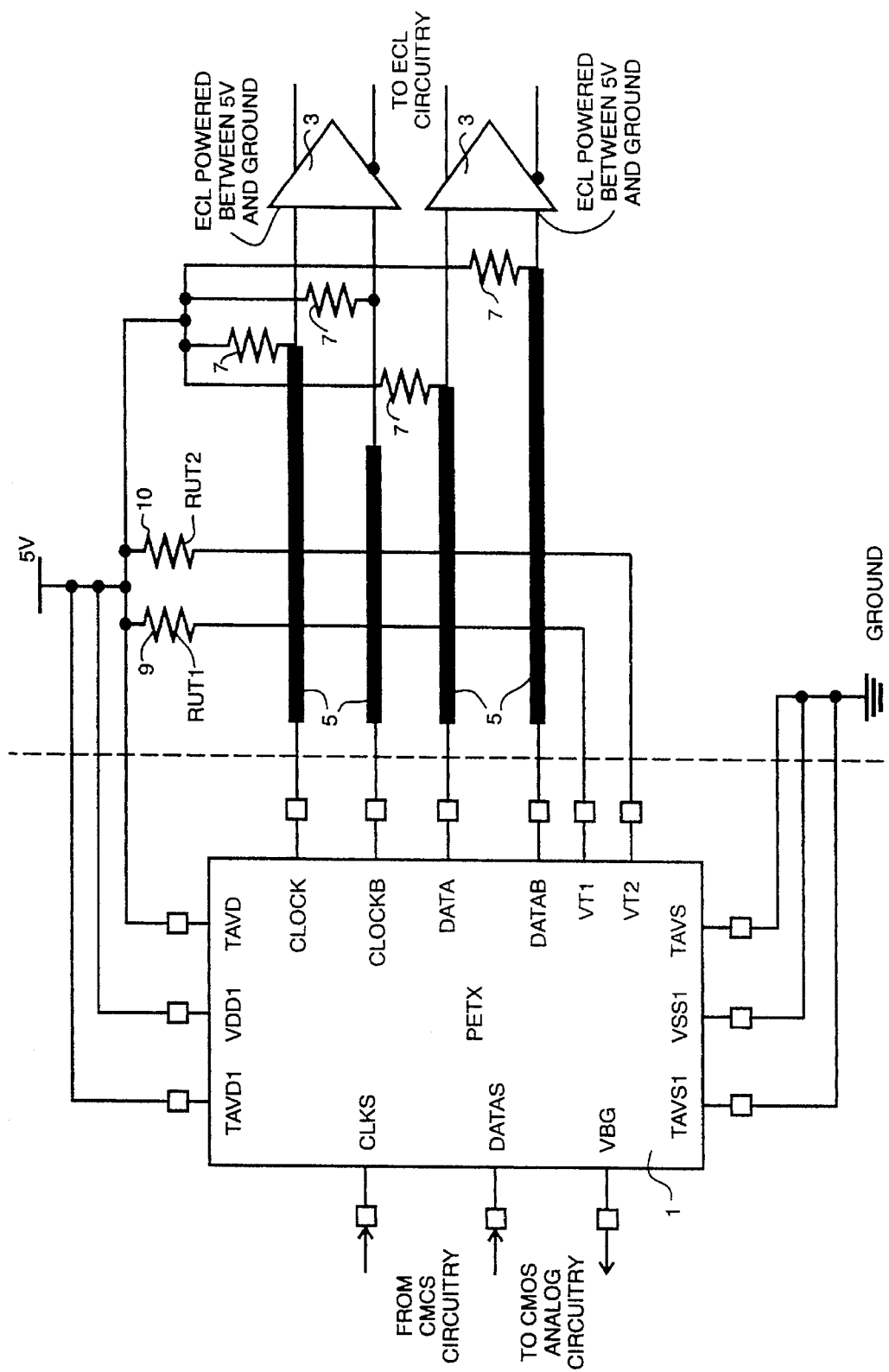

FIG. 1 illustrates the invention in broadest concept. A translator, which will be referred to below as a PETX (pseudo ECL transmitter), translates single-ended signals received from CMOS circuitry, shown as clock signals applied to a CLKS input and data signals applied to a DATAS input, into fully differentiated signals for application to ECL circuits 3. The signals for application to the ECL circuits are output from the PETX 1 to transmission lines 5, which have predetermined characteristic impedances, from differentiated clock signal output terminals CLOCK and CLOCKB, and data signal output terminals DATA and DATAB.

Load resistors 7 terminate each of the transmission lines 5, in a well known manner. For example if the characteristic impedance of the transmission lines is 100 ohms, the resistance of each load should be 100 ohms.

Various power inputs of the PETX TAVD1, VDD1 and TAVD are connected to 5 V, the 5 volt power supply terminal that supplies the CMOS circuits from which the CMOS circuits are powered, and supply terminals TAVS1, VSS1 and TAVS are connected to ground. The load resistors are also connected to 5 V, as are the ECL circuits.

As noted earlier, it is a requirement of this invention to provide digital signals corresponding to the input signals from the CMOS circuits which normally output logic signal voltage values between +5 volts for a logical "1" and 0 volts (ground) for a logical "0" to logic signal voltage values that can be received and translated properly by the ECL circuits, which logic voltage values are normally between −0.8 volts for a logical "1" and −1.8 volts for a logical "0". CMOS circuits are nominally powered with a 5 volt power supply, and ECL circuits are powered with a −4.8 to −5.2 volt supply.

As noted above, the ECL circuits are powered from the same 5 volt supply as are the CMOS circuits. Thus the present invention must translate the input CMOS logic levels to the correct logic voltage values, and with a similar voltage swing (i.e. 1 volt) but at the correct reference level to accommodate the power supply reference level used by the ECL circuits.

The preferred embodiment of the present invention uses a 1 bit digital to analog converter (DAC), to be described in more detail below, which converts a CMOS input signal into differentiated output signals, and a pair of programmable current steering switches connected to the DAC to establish higher and lower logic level output currents for the opposite logic values of the output signals.

The steering circuits are programmed by means of two resistors 9 and 10 connected to 5 V and respectively to VT1 and VT2 terminals of the PETX, which will be referred to below as resistors $R_{VT1}$ and $R_{VT2}$ respectively. The values of these resistors are determined according to the following equations:

$$R_{VT1}=2*K_{VT1}*R_L/V_{POH}$$

and $$R_{RVT2}=2*K_{VT2}*R_L/V_{POL}$$

where $K_{VT1}=7.12$ $K_{VT2}=6.282$ $V_{POH}$ is the ECL compatible high logic level output voltage (referenced to TAVD, connected to 5 V), and $-1.0<=V_{POH}<=-0.8$ $-1.8<=V_{POL}<=-1.6$ $R_L$ is the characteristic impedance of the transmission line, e.g. 100 ohms.

The above provides a translation system that both translates CMOS logic signals into pseudo-ECL logic signals, references them to a single power supply, the power supply of the CMOS circuits, and provides for the ECL circuits to be powered from the same power supply as the CMOS circuits. Further, the output transmission lines are terminated be loads connected to the same power supply. Both the high and low logic voltage levels of the pseudo-ECL logic signals can be controlled, and referenced to the same power rails to which the CMOS circuits and the ECL circuits are connected. The result is a stable mixed-CMOS and ECL system which can provide improved cost and performance of such a system, and gives the designer increased design flexibility.

A better understanding of the structural location of the DAC and programmable current steering switches will be obtained after the architecture of the system is described.

Figure 2:
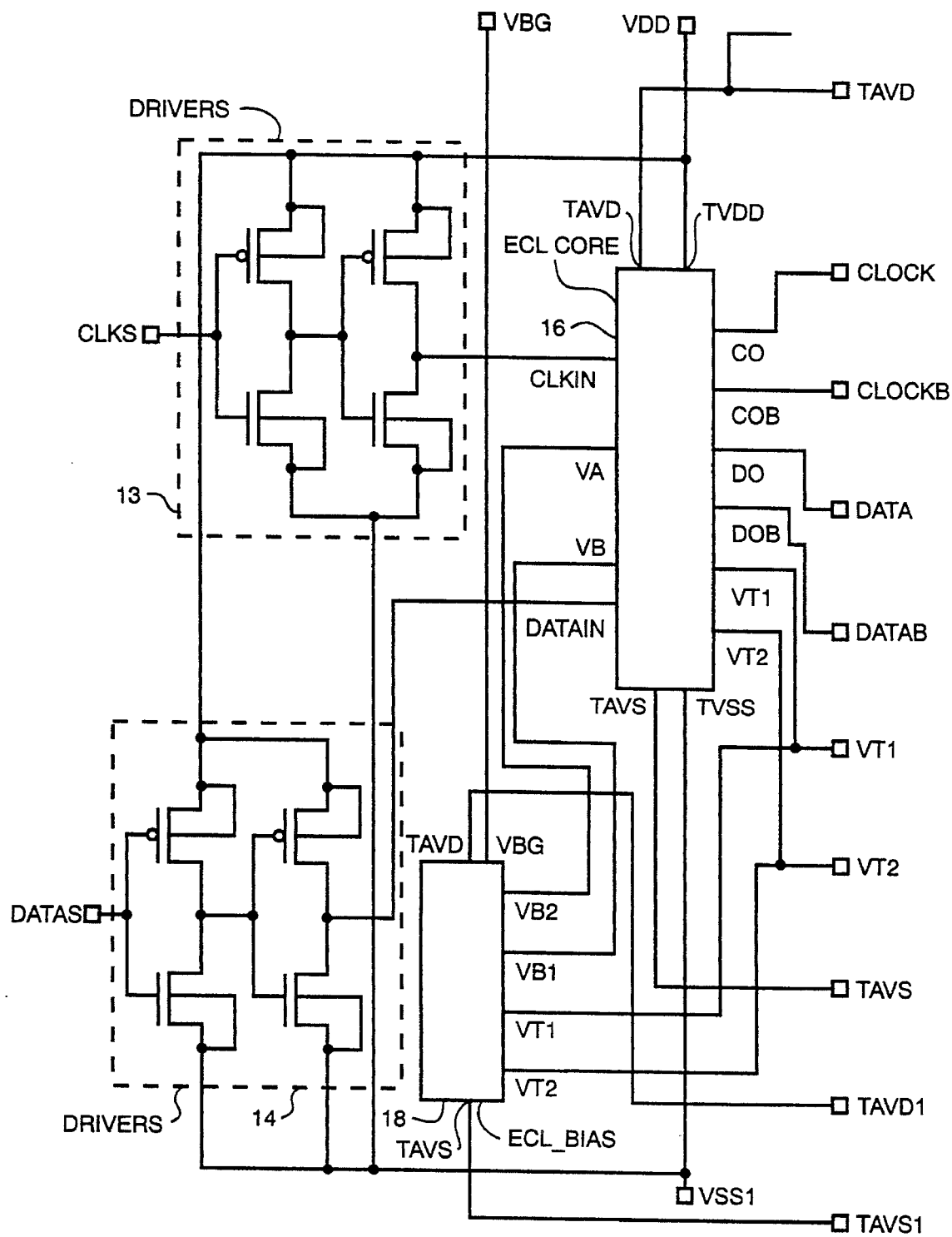

With reference to FIG. 2, a block diagram of the PETX 1 is shown. While the circuit can be constructed to translate only one data signal, it will be described translating two signals, a clock signal CLKS and a data signal DATAS. The PETX receives CMOS clock and data signals at inputs CLKS and DATAS of drivers 13, 14 (formed of CMOS field effect transistors FETs), which buffer the CMOS logic signals (improving the signal shapes), and which apply the resulting signals to CLKIN and DATAIN inputs of an ECL CORE circuit 16. The ECL CORE circuit is a high speed, 1-bit digital to analog converter (DAC).

An ECL BIAS circuit 18 is connected to the ECL CORE circuit 16, and adjusts the ECL CORE reference voltages VA and VB dynamically over variations in temperature, supply voltage and of the production process. The aforenoted resistors $R_{VT1}$ and $R_{VT2}$ between the 5 V supply and the VT1 and VT2 terminals establish the operating points for the nodes to which the voltages VA and VB are connected.

The three groups of power supplies connected to the terminals noted with reference to FIG. 1 provide the following: TAVD1 and TAVS1 supplies the ECL BIAS circuit 18, TAVD and TAVS supplies the high current sections of the ECL CORE circuit 16, and VDD1 and VSS1 supplies the high speed logic portion of the ECL CORE circuit 16.

Outputs of the ECL CORE circuit are the differentiated pseudo-ECL logic signals: the clock output signals CLOCK and CLOCKB, the data output signals DATA and DATAB, and the pseudo-ECL output signal logic level programming terminals VT1 and VT2.

Figure 3:
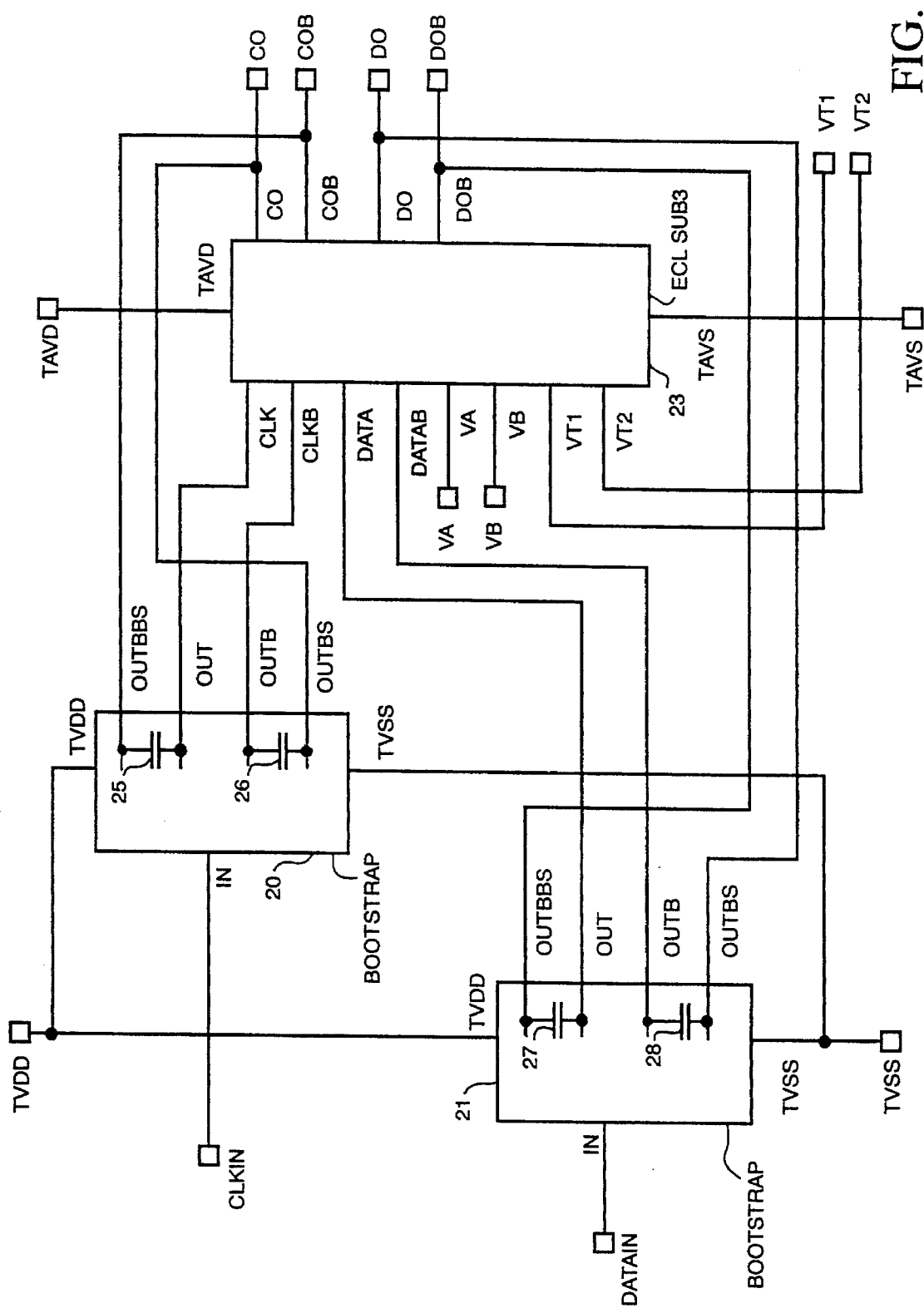

FIG. 3 illustrates a block diagram of the ECL CORE circuit 16. The ECL CORE circuit is comprised of bootstrap circuits 20 and 21, each for signal splitting the respective CMOS input signals CLKIN and DATAIN received from the drivers 13 and 14, into fully differentiated pseudo-ECL output pairs of signals into a delayed in-phase CMOS signal and a delayed 180 degree out-of-phase CMOS signal, and waveshapes them. The output resulting differentiated signals are OUT and OUTB.

These signals are applied to respective terminals of an ECL SUB3 circuit 23 as follows. The output signals of bootstrap circuit 20 are applied to CLK and CLKB input terminals of the ECL SUB3 circuit, and the output signals of the bootstrap circuit 21 are applied to DATA and DATAB input terminals of the ECL SUB3 circuit.

In addition, output terminals OUTBS and OUTBBS of bootstrap circuit 20 are internally capacitively coupled by means of capacitors 25 and 26 respectively to output terminals OUT and OUTB, and output terminals OUTBS and OUTBBS of bootstrap circuit 21 are internally capacitively coupled by means of capacitors 27 and 28 respectively to output terminals OUT and OUTB of bootstrap circuit 21. The signals carried by the OUTBS and OUTBBS terminals are used as bootstrap signals as will be described below.

The ECL SUB3 circuit is comprised of an array of current steering elements referred to earlier, and provides differentiated clock and data output signals at terminals CO, COB, and DO, DOB respectively, which correspond to the CLOCK, CLOCKB, DATA and DATAB terminals in the description of FIG. 1.

Wave-shaping is performed based on the charge conservation principle. The terminals CO, COB, DO and DOB have large capacitive loads, as a result of integrated circuit pin, diffusion and internal metal parasitic capacitance. The output voltage swing expected at these terminals is small, nominally one volt. In order to improve this voltage swing and make it more robust, the bootstrap signals described above which are in phase with the signals carried on the output terminals are applied to those output terminals, i.e. the signals from OUTBS of bootstrap circuit 20 to output terminal CO, the signals from OUTBBS of bootstrap circuit 20 to terminal COB, the signals from OUTBS of bootstrap circuit 21 to terminal DO and the signals from OUTBBS of bootstrap circuit 21 to terminal DOB.

The coupling capacitors 25, 26, 27 and 28 supply the charge required to drive the output parasitic capacitive loads, and can be much smaller than these parasitic capacitive loads because of their much larger drive.

The value of each bootstrap capacitor 25, 26, 27 and 28 $C_{bs}$ can be calculated by the following equation:

$$C_{bs}*(dV_{in}-dV_{out})=C_p*(dV_{out})$$

where $C_p$ is the parasitic load capacitance at an output CO, COB, DO and DOB, $dV_{out}$ is the output voltage swing, and $dV_{in}$ is the bootstrap voltage swing.

Typical values for $dV_{in}$, $dV_{out}$ and $C_p$ are 5 volts, 1 volt and 10 pf respectively. In this case a nominal value for $C_{bs}$ is 2 pf.

Figure 4:
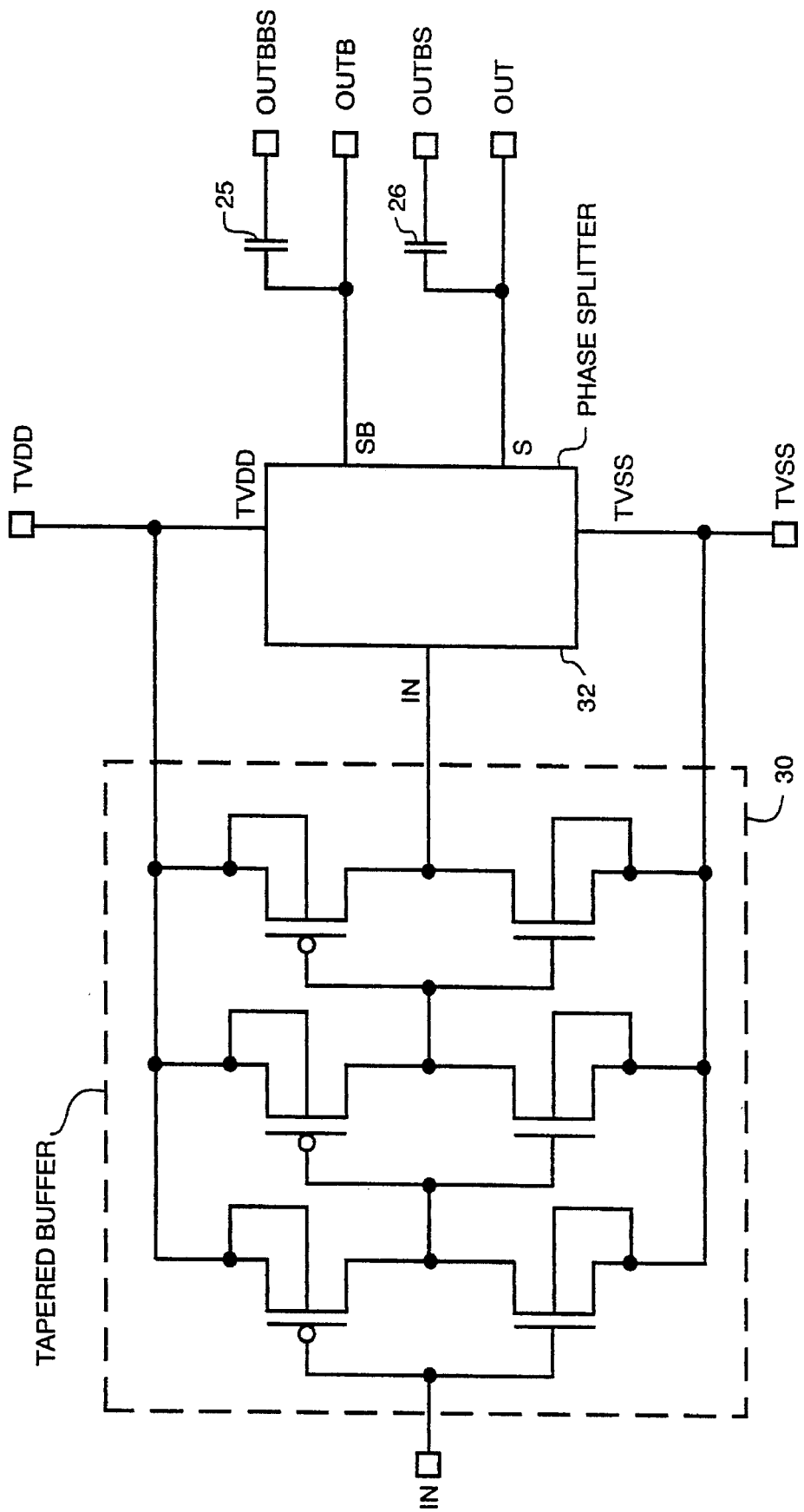

FIG. 4 illustrates one of the identical bootstrap circuits 20 and 21. This circuit is comprised of a tapered buffer 30, which receives a CLKIN or DATAIN signal at its IN terminal and applies its output signal to the IN terminal of a high speed phase splitter 32. The phase splitter splits its input signal into two signals SB and S, and applies them to the terminals OUT and OUTB, with the signal carried by terminal OUTB 180 degrees out of phase with the signal carried by terminal OUT. Capacitors 25 and 26, for example, carry the signals from terminal OUT and OUTB respectively to terminals OUTBS and OUTBBS.

The signal presented to the bootstrap circuits have been found to suffer a substantial amount of degradation due to the substantial distance between input cell elements. The tapered buffer 30 ensures that the signal input to the phase splitter 32 has a short ramp time, e.g. less than 1 ns. This is important if low duty-cycle distortion and a robust eye-pattern for the pseudo-ECL output signals is desired.

Figures 5, 7:
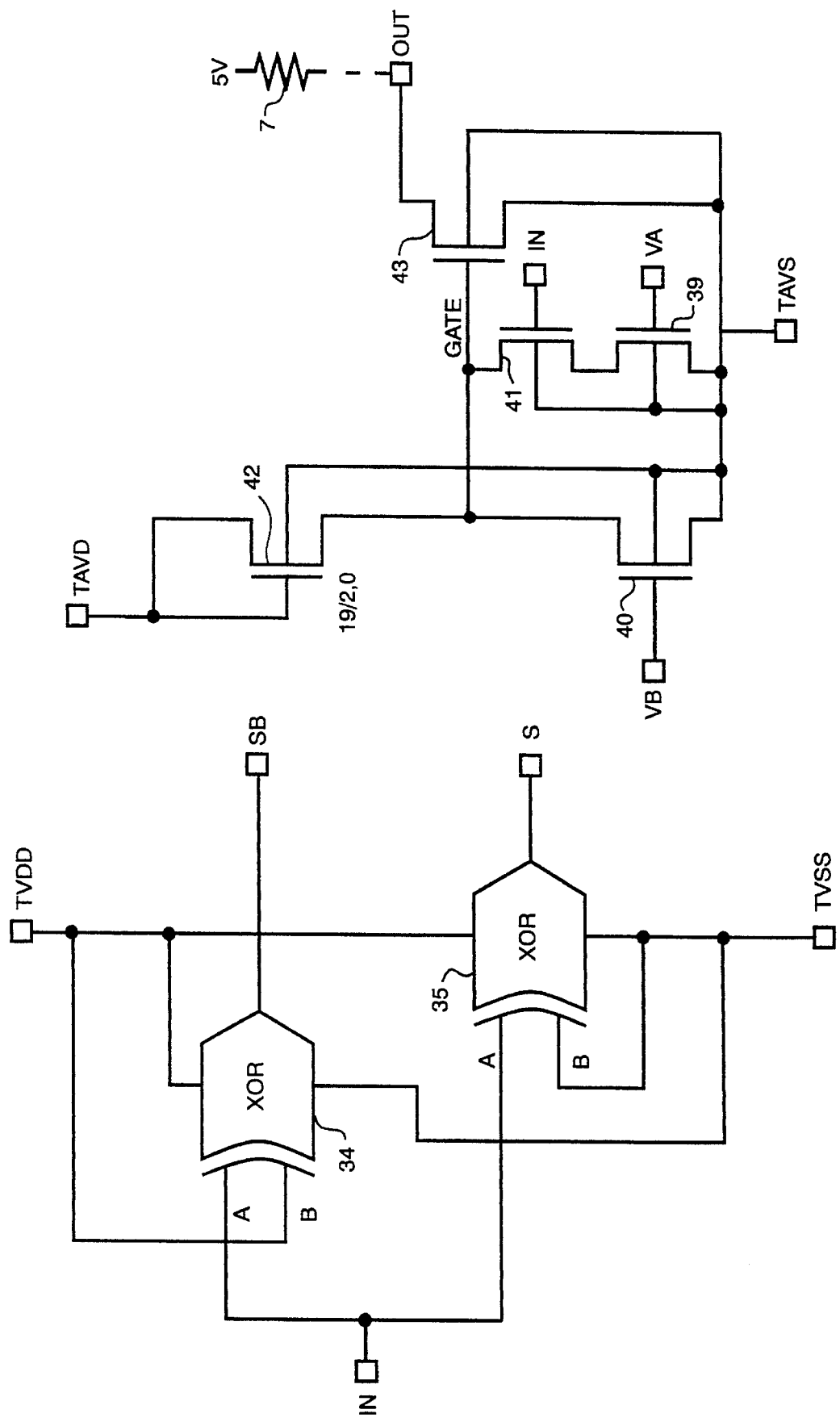

The phase splitter is formed of two exclusive OR (XOR) gates in a circuit as shown in FIG. 5. The input is applied to one input of each of two XOR gates 34 and 35. The other input of gate 34 is connected to power terminal TVDD and the other input of gate 35 is connected to the return (ground) terminal TVSS. The output terminal SB and S of the XOR gates 34 and 35 provide the phase split signals for application to terminals OUT and OUTB.

This phase splitter circuit is preferred because it provides symmetrical propagation delays for high/low or low/high input transitions, and thus ensures low output signal skews. The output of the phase splitter should be able to drive a 15 pf load, and the tapered buffer in the XOR output will facilitate this loading.

The ECL SUB3 circuit 23 will now be described with reference to FIG. 6. Each of the DATA, DATAB, CLK and CLB signals is applied to an array 37 of ten ECL TX2 elements, all of the elements in each array operating in parallel. The outputs of the arrays are respectively DO, DOB, CO and COB, described with reference to FIG. 2. A single grouping of ten elements constitutes a 1-bit, high speed DAC.

In addition, two arrays each of two ECL TX2 elements generate internal bias voltages VA and VB. The output (logic) current levels are controlled by the bias voltages VA and VB, which are in turn affected by the voltages applied via the external resistors 10 (FIG. 1)to their VT1 and VT2 terminals, described earlier, which pull the VT1 and VT2 terminals to the positive voltage supply rail 5 V.

Reference is now made in addition to FIG. 7, which is a schematic diagram of an ECL TX2 element, which is a programmable current steering switch. The voltages VA and VB, generated by the two 2 element arrays, are applied to the respective gates of FETs 39 and 40, the sources of which are connected to the TAVS ground terminal. The drain of FET 40 is connected to the source of FET 42, and the drain of FET 39 is connected to the source of FET 41. The drain of FET 42 is connected to the TAVD power terminal, and the drain of FET41 is connected to the source of FET 42. That point is also connected to the gate of FET 43, the source of which is connected to ground terminal TAVS, and the drain of which is connected to the OUT terminal. The gate of FET 41 is designated as the IN terminal.

Figure 6:
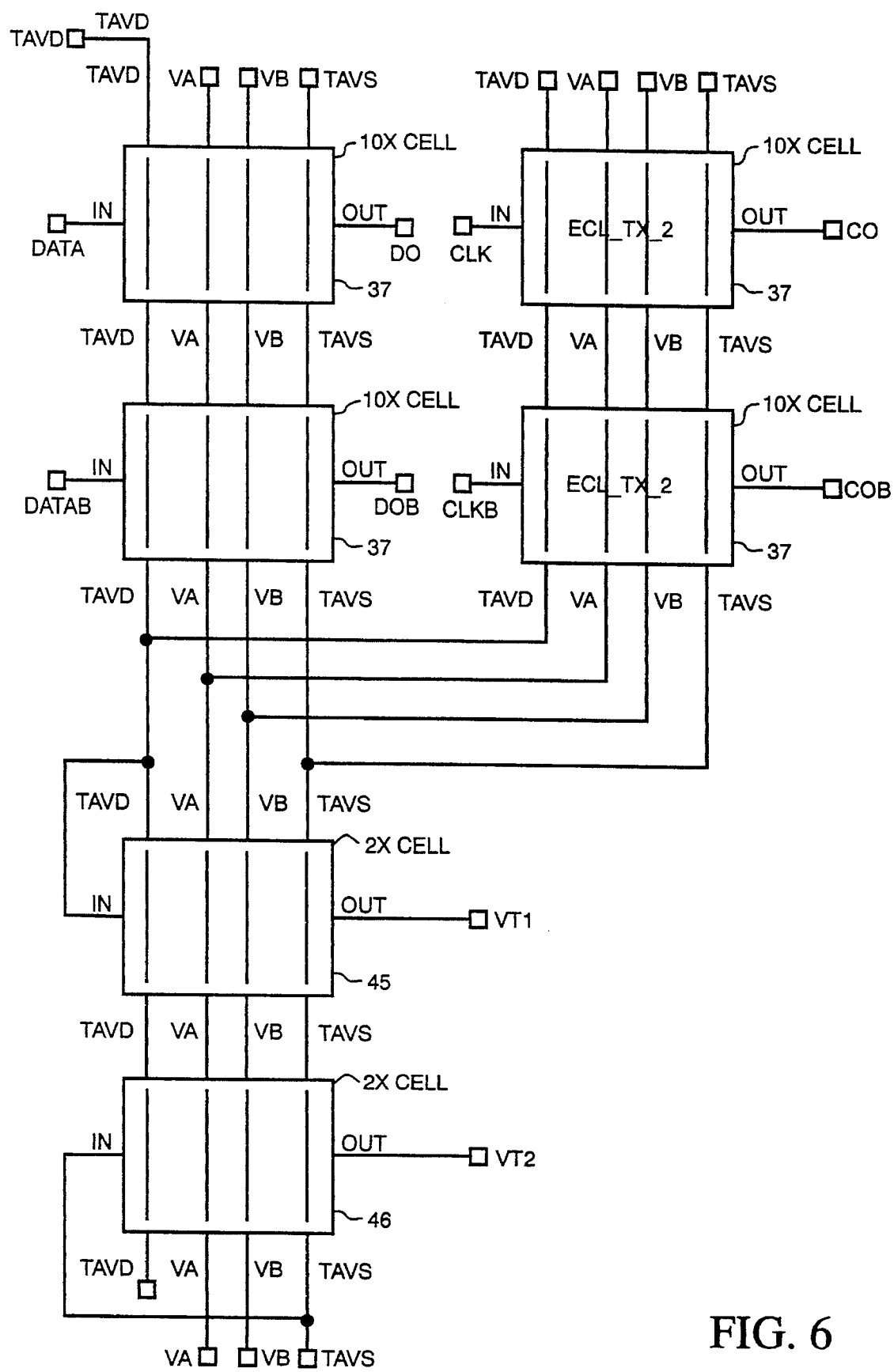

The OUT terminal of each array is connected to the DO, DOB, CO and COB terminals respectively (see FIG. 6).

In operation, if the signal at the IN input is a logical "1" the voltage at the gate of FET 43 is low due to FETs 41 and 39 conducting, drawing the voltage at gate 43 low relative to voltage TAVD. As a result, FET 43 does not conduct, and the output current passing through the source-drain circuit of FET 43 and through the load resistor connected to the OUT terminal (see FIG. 1) is at a minimum value. Therefore the voltage drop across the load resistor is at a minimum, and a logic "1" voltage is appear across the transmission line to the input of the ECL circuit to which it is connected.

In a similar manner, when a logical "0" appears at the input terminal IN, the voltage at the gate of FET 43 is high due to FETs 41 and 39 being switched into their non-conductive states, and FET 43 conducts, drawing maximum current through its source-drain circuit and the load resistor connected the OUT terminal, thus causing high current, and thus a high logic level voltage to appear across the transmission line to the input of the ECL circuit.

The voltage level of the control signals VA and VB applied to the gates of FETs 39 and 40 respectively control the threshold of conduction of FETs 39 and 40, and therefore the threshold of conduction of the series of FETs 39 and 41, and FETs 40 and 42 respectively. Thus the control signal VA determines the level of current carried by FET 43 for a logical "0" and logical "1" respectively, and thus the current and voltage for these states in the load resistor.

Figure 8:
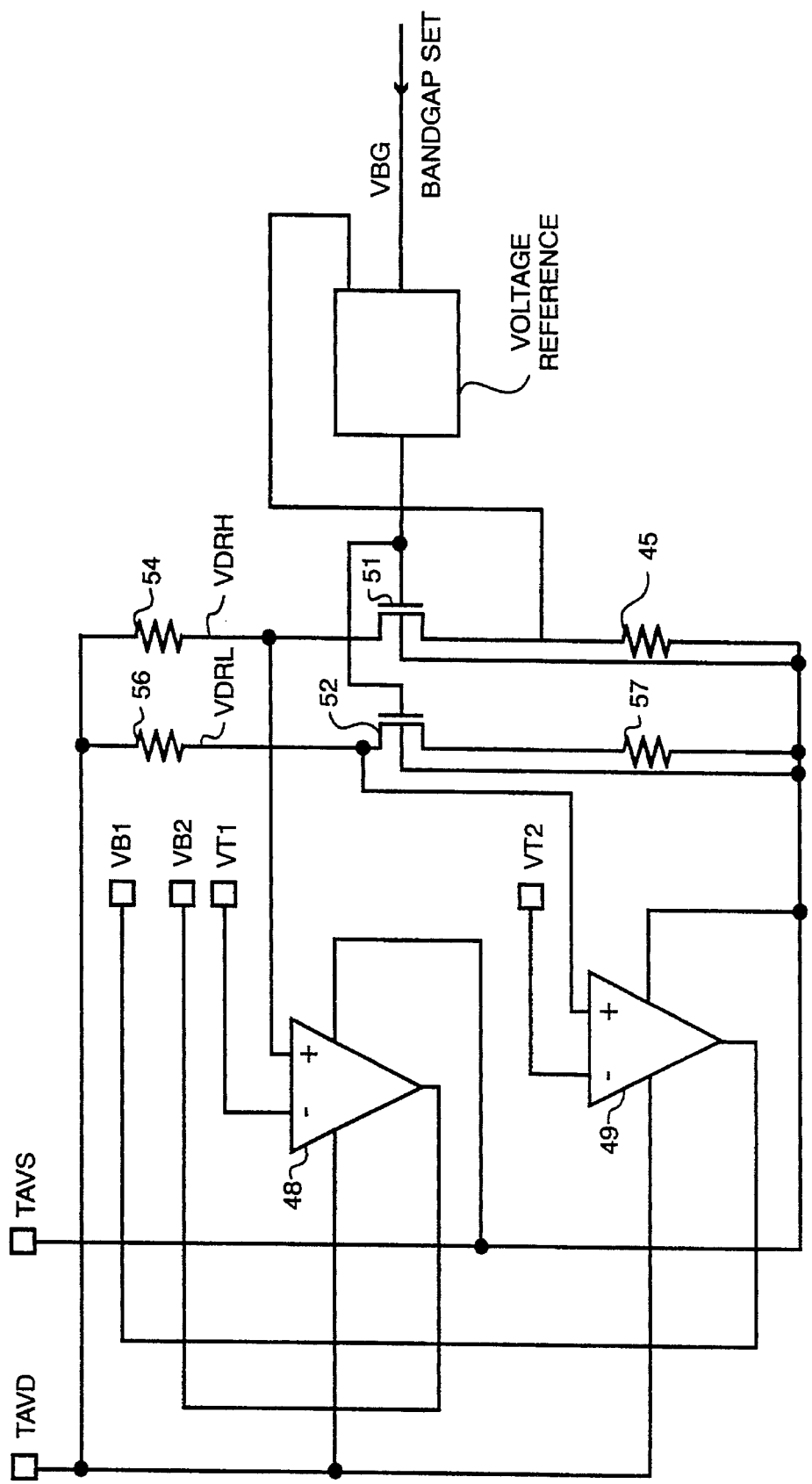

The voltages VA and VB thus are important to determine the pseudo-ECL logical voltage levels. These voltages are generated by the ECL TX2 circuits in the two arrays 45 and 46 (FIG. 6). With reference to FIG. 8, the voltages VA and VB are generated in two feedback loops each using two ECL TX2 cells. The inverting input of an operational amplifier 48 is connected to VT2, and its non-inverting input to an internal reference designated by VDRL. The output of operational amplifier 48 is VB1. Similarly, the inverting input of operational amplifier 49 is connected to VT1 and its non-inverting input to an internal reference designated by VDRH. Its output is VB2.

The two ECL TX2 circuits have their IN inputs tied to logical "0". The internal voltage reference circuit can be of well known form, e.g. a bandgap supply driving an operational amplifier, which is connected to the gate of FETs 51 and 52, and should be temperature compensated and create a constant 2 volts below the positive rail (due to the operational amplifier's virtual ground), and should be constant over process and temperature. The voltage references are comprised of resistors 54, 55 and 56,57 connected in series with the source-drain circuits of FETs 51 and 52 respectively, between the TAVD and TAVS terminals. This dynamically determines the value of VB for all the ECL TX2 circuits, and hence the logical "0" output current level. The voltage VA is determined in a similar fashion, but the ECL TX2 circuits have their inputs IN tied to a logical "1" and the terminals VT1 and VA are used in a separate feedback loop from the one described above.

The VA and VB control voltages are thereby produced in arrays 45 and 46, and are supplied to the arrays 37, which operate as described earlier.

It should be noted that the application of a "0" state to the gate of FET 43 determines the output logical "0" current level. The determination of this state in no way depends on the value of VA. If there is a "1" state applied to the gate of FET 43, an output logical "1" current level results. The value of VA in this case is dependent on the value of VB, but since the feedback loops that determine there control voltages are separate, the dynamics of VA and VB are not coupled.

Since the current sunk into the VT1 and VT2 terminals control, with the VDRL and VDRH voltages, the outputs of operational amplifiers 48 and 49, these currents uniquely determine the potentials VA and VB. Changing the termination resistors 10 (FIG. 1) between terminals VT1 and VT2 and the positive supply adjusts the VA and VB voltages, and the DACs logical "low" and "high" output levels.

A person understanding this invention may now conceive of alternative structures and embodiments or variations of the above. All of those which fall within the scope of the claims appended hereto are considered to be part of the present invention.

We claim:

1. A complementary metal oxide silicon (CMOS) data to emitter coupled logic (ECL) data translator system comprising:

(a) translator means for receiving data signals from a CMOS circuit, which CMOS circuit is powered from a CMOS voltage power source, (b) means for powering an ECL circuit from said power source, (c) a transmission line carrying output signals from the translator means to the ECL circuit, having a predetermined characteristic impedance, (d) a load having said characteristic impedance connecting the transmission line to said power source, (e) the translator means comprising means for outputting a data signal on the transmission line which corresponds to said received data signals but having an amplitude compatible with said ECL circuit and referenced to a voltage of said power source, and being formed of a one bit digital to analog converter (DAC) and is further comprised of a pair of programmable current steering switches a connected to the DAC for establishing higher and lower output currents for opposite logic values of the output signals, means for applying said data signals to the DAC and for receiving said output signals and applying them to said transmission line.

2. A system as defined in claim 1, including resistor means for programming said current steering switches, each connected to one of said switches, the resistor means having the values $$R_{VT1} = 2 * K_{VT1} * RL_L / V_{POH}$$

and $$R_{VT2} = 2 * K_{VT2} * R_L / V_{POL}$$

where
$K_{VT1} = 7.12$
$K_{VT2} = 6.282$
$V_{POH}$ is the ECL compatible high logic level output voltage (referenced to TAVD, connected to 5 V), and $$-1.0 <= V_{POH} <= -0.8$$

$$-1.8 <= V_{POL} <= -1.6$$

$R_L$ is the characteristic impedance of the transmission line.

3. A system as defined in claim 1 including means for splitting the received data signals into an input in-phase and an output 180 degrees out-of-phase signal and for applying the in-phase and out-of-phase signals to a pair of DACs for translation therein into in-phase and out-of-phase output signals, and means for capacitively coupling the input in-phase and input out-of-phase signals to terminals carrying the translated in-phase and out-of-phase signals to form bootstrapped in-phase and out-of-phase output signals.

4. A system as defined in claim 3 in which the capacitive coupling means is comprised of capacitors each having the value $$C_{bs} * (dV_{in} - dV_{out}) = C_p * (dV_{out})$$

where $C_p$ is the parasitic load capacitance at an output CO, COB, DO and DOB, $dV_{out}$ is the output voltage swing of the DACs, and $dV_{in}$ is the bootstrap voltage swing of the DAC.

5. A system as defined in claim 2 including means for splitting the received data signals into an input in-phase and an output 180 degrees out-of-phase signal and for applying the in-phase and out-of-phase signals to a pair of DACs for translation therein into in-phase and out-of-phase output signals, and means for capacitively coupling the input in-phase and input out-of-phase signals to terminals carrying the translated in-phase and out-of-phase signals to form bootstrapped in-phase and out-of-phase output signals.

6. A system as defined in claim 5 in which the capacitive coupling means is comprised of capacitors each having the value $$C_{bs} * (dV_{in} - dV_{out}) = C_p * (dV_{out})$$

where $C_p$ is the parasitic load capacitance at an output CO, COB, DO and DOB, $dV_{out}$ is the output voltage swing of the DACs, and $dV_{in}$ is the bootstrap voltage swing of the DAC.

* * * * *